(12) United States Patent
Goto et al.

(10) Patent No.: US 12,308,827 B2
(45) Date of Patent: May 20, 2025

(54) MULTILAYER PIEZOELECTRIC SUBSTRATE DEVICE WITH POSITIVE TEMPERATURE COEFFICIENT OF FREQUENCY DIELECTRIC FILM FOR TEMPERATURE STABILITY

(71) Applicant: Skyworks Solutions, Inc., Irvine, CA (US)

(72) Inventors: Rei Goto, Osaka (JP); Hironori Fukuhara, Ibaraki (JP)

(73) Assignee: Skyworks Solutions, Inc., Irvine, CA (US)

(*) Notice: Subject to any disclaimer, the term of this patent is extended or adjusted under 35 U.S.C. 154(b) by 184 days.

(21) Appl. No.: 17/929,066

(22) Filed: Sep. 1, 2022

(65) Prior Publication Data

US 2023/0117464 A1  Apr. 20, 2023

Related U.S. Application Data

(60) Provisional application No. 63/262,547, filed on Oct. 14, 2021, provisional application No. 63/262,551, filed on Oct. 14, 2021, provisional application No. 63/262,546, filed on Oct. 14, 2021.

(51) Int. Cl.
| | | |
|---|---|---|
| H03H 9/64 | (2006.01) |
| H03H 9/02 | (2006.01) |
| H03H 9/10 | (2006.01) |
| H03H 9/145 | (2006.01) |
| H03H 9/54 | (2006.01) |

(52) U.S. Cl.
CPC ...... *H03H 9/6489* (2013.01); *H03H 9/02559* (2013.01); *H03H 9/02574* (2013.01); *H03H 9/02637* (2013.01); *H03H 9/02834* (2013.01); *H03H 9/1064* (2013.01); *H03H 9/14544* (2013.01); *H03H 9/54* (2013.01); *H03H 9/6483* (2013.01)

(58) Field of Classification Search
CPC ............ H03H 9/6489; H03H 9/02559; H03H 9/02574; H03H 9/02637; H03H 9/02834; H03H 9/1064; H03H 9/14544; H03H 9/54; H03H 9/6483
See application file for complete search history.

(56) References Cited

U.S. PATENT DOCUMENTS

2018/0159494 A1* 6/2018 Goto .................. H03H 9/02574

* cited by examiner

*Primary Examiner* — Andrea Lindgren Baltzell
*Assistant Examiner* — Kimberly E Glenn
(74) *Attorney, Agent, or Firm* — Knobbe, Martens, Olson & Bear LLP

(57) ABSTRACT

An acoustic wave filter includes a substrate and a piezoelectric layer over the substrate. First acoustic wave resonators are disposed over the piezoelectric layer and arranged in series along a first branch, and second acoustic wave resonators are disposed over the piezoelectric layer, arranged in parallel, and connected to the first branch and to ground. The first and second acoustic wave resonators include an interdigital transducer electrode interposed between a pair of reflectors. A layer of positive temperature coefficient of frequency dielectric material is disposed over one or more of the first plurality of acoustic wave resonators to control the temperature coefficient of frequency and improve temperature stability of the acoustic wave filter.

18 Claims, 15 Drawing Sheets

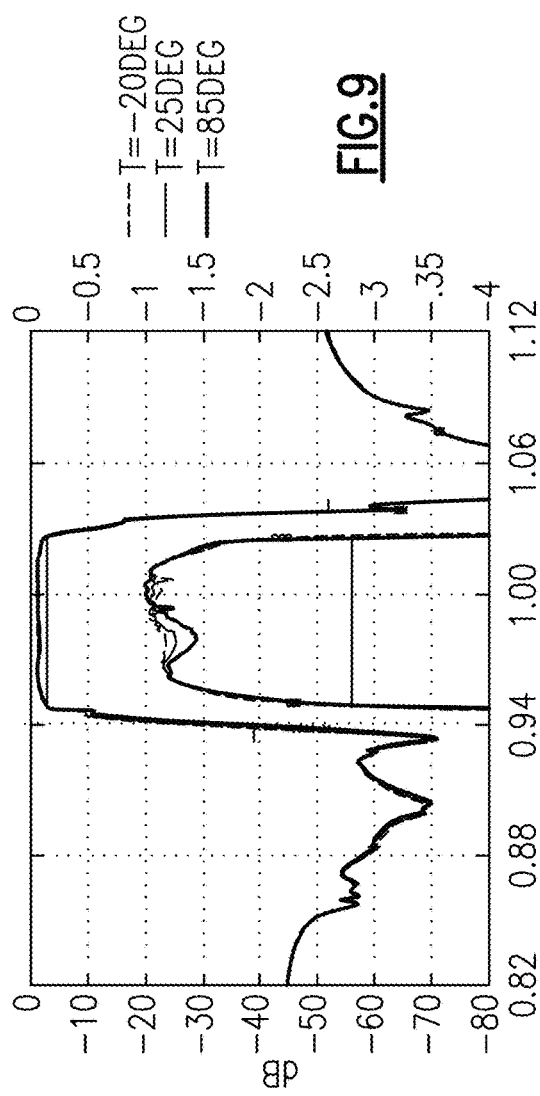
FIG. 9
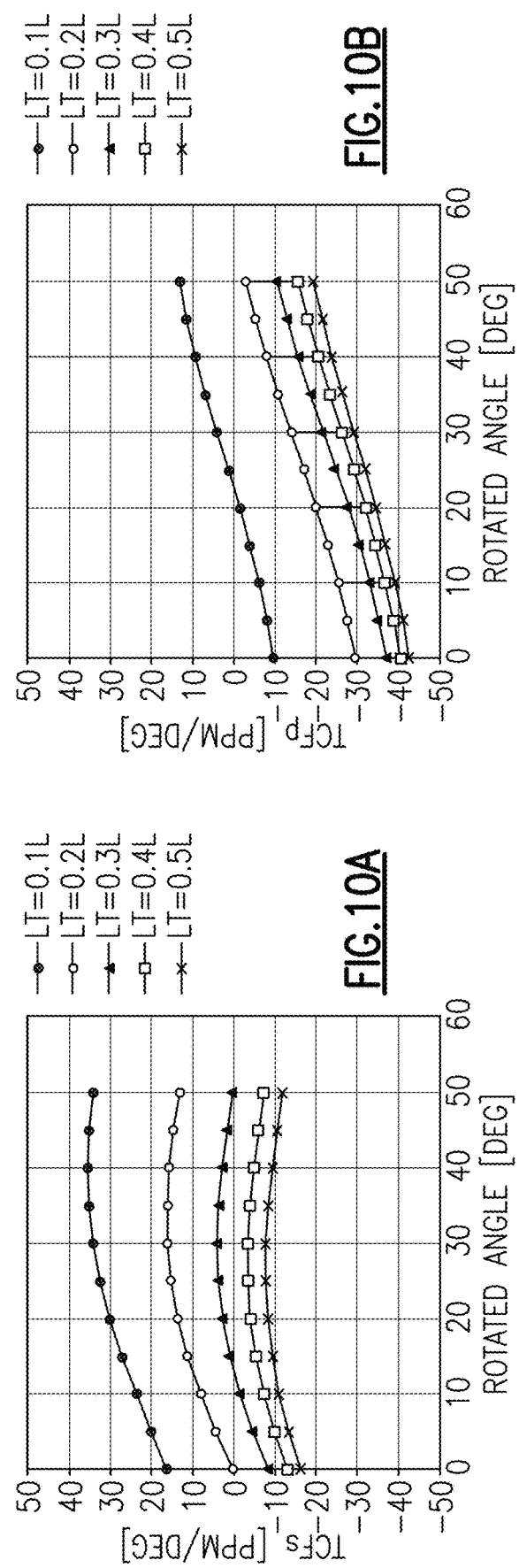
FIG. 10B
FIG. 10A

MULTILAYER PIEZOELECTRIC SUBSTRATE DEVICE WITH POSITIVE TEMPERATURE COEFFICIENT OF FREQUENCY DIELECTRIC FILM FOR TEMPERATURE STABILITY

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave devices, and more particularly to multilayer piezoelectric substrate devices with improved temperature stability.

Description of Related Technology

An acoustic wave filter can include a plurality of acoustic resonators arranged to filter a radio frequency signal. Example acoustic wave filters include surface acoustic wave (SAW) filters and bulk acoustic wave (BAW) filters. A surface acoustic wave resonator of a surface acoustic wave filter typically includes an interdigital transducer electrode on a piezoelectric substrate. A surface acoustic wave resonator is arranged to generate a surface acoustic wave.

Acoustic wave filters can be implemented in radio frequency electronic systems. For instance, filters in a radio frequency front end of a mobile phone can include acoustic wave filters. Ideally, the filters allow frequencies in a specific frequency band and filter out or reject frequencies outside the band, within an operating temperature range. However, existing filters have a temperature coefficient of frequency (TCF) near zero for anti-resonant frequency but resonant TCF that can have a positive value, which results in an edge of the band having a lower slope and degraded attenuation (at low temperature).

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In accordance with one aspect of the disclosure, an acoustic filter device is provided with improved temperature stability.

In accordance with another aspect of the disclosure, an acoustic filter device is provided with improved rejection performance for a wide band pass filter.

In accordance with one aspect of the disclosure, an acoustic filter device (e.g., ladder filter device) is provided having one or more resonators connected in series ("series resonators") and one or more resonators connected in parallel and connected to ground ("parallel resonators" or "shunt resonators"). One or more (e.g., all, fewer than all) of the shunt resonators are covered by a film or layer of negative temperature coefficient of frequency (TCF) material and the series resonators are uncovered (e.g., not covered by a film or layer of negative TCF) to tune the TCF values to improve a lower skirt TCF of the filter device (e.g., synchronize the TCF of the resonant and anti-resonant frequencies for the series resonators and shunt resonators).

In accordance with one aspect of the disclosure, an acoustic filter device (e.g., ladder filter device) is provided having one or more resonators connected in series ("series resonators") and one or more resonators connected in parallel and connected to ground ("parallel resonators" or "shunt resonators"). One or more (e.g., all, fewer than all) of the series resonators are covered by a film or layer of positive temperature coefficient of frequency (TCF) material and the shunt resonators are uncovered (e.g., not covered by a film or layer of positive TCF) to tune the TCF values to improve a lower skirt TCF of the filter device (e.g., synchronize the TCF of the resonant and anti-resonant frequencies for the series resonators and shunt resonators).

In accordance with one aspect of the disclosure, an acoustic filter device (e.g., ladder filter device) is provided having one or more resonators connected in series ("series resonators") and one or more resonators connected in parallel and connected to ground ("parallel resonators" or "shunt resonators"). One or more (e.g., all, fewer than all) of the shunt resonators have an interdigital transducer (IDT) with a wider duty factor (DF) than one or more (e.g., all, fewer than all) of the series resonators to tune the TCF values to improve a lower skirt TCF of the filter device (e.g., synchronize the TCF of the resonant and anti-resonant frequencies for the series resonators and shunt resonators).

In accordance with one aspect of the disclosure, an acoustic filter device (e.g., ladder filter device) is provided having one or more resonators connected in series ("series resonators") and one or more resonators connected in parallel and connected to ground ("parallel resonators" or "shunt resonators"). One or more (e.g., all, fewer than all) of the series resonators have an interdigital transducer (IDT) with a wider duty factor (DF) than one or more (e.g., all, fewer than all) of the shunt resonators to tune the TCF values to improve a lower skirt TCF of the filter device (e.g., synchronize the TCF of the resonant and anti-resonant frequencies for the series resonators and shunt resonators).

In accordance with one aspect of the disclosure, an acoustic filter device (e.g., ladder filter device) is provided having one or more resonators connected in series ("series resonators") and one or more resonators connected in parallel and connected to ground ("parallel resonators" or "shunt resonators"). One or more (e.g., all, fewer than all) of the shunt resonators are covered by a film of negative temperature coefficient of frequency (TCF) material having a first thickness and one or more (e.g., all, fewer than all) of the series resonators are covered by a film of negative temperature coefficient of frequency (TCF) material of a second thickness, the second thickness being smaller than the first thickness to tune the TCF values to improve a lower skirt TCF of the filter device (e.g., synchronize the TCF of the resonant and anti-resonant frequencies for the series resonators and shunt resonators).

In accordance with one aspect of the disclosure, an acoustic filter device (e.g., ladder filter device) is provided having one or more resonators connected in series ("series resonators") and one or more resonators connected in parallel and connected to ground ("parallel resonators" or "shunt resonators"). One or more (e.g., all, fewer than all) of the shunt resonators are covered by a film of positive temperature coefficient of frequency (TCF) material having a first thickness and one or more (e.g., all, fewer than all) of the series resonators are covered by a film of positive temperature coefficient of frequency (TCF) material of a second thickness, the second thickness being larger than the first thickness to tune the TCF values to improve a lower skirt TCF of the filter device (e.g., synchronize the TCF of the resonant and anti-resonant frequencies for the series resonators and shunt resonators).

In accordance with one aspect of the disclosure, an acoustic filter device (e.g., ladder filter device) is provided having one or more resonators connected in series ("series resonators") and one or more resonators connected in parallel and connected to ground ("parallel resonators" or "shunt resonators"). One or more (e.g., all, fewer than all) of the shunt resonators are covered by a film of negative temperature coefficient of frequency (TCF) material having a first thickness and one or more (e.g., all, fewer than all) of the series resonators are covered by a film of negative temperature coefficient of frequency (TCF) material of a second thickness smaller than the first thickness, and one or more (e.g., all, fewer than all, one, two) of the shunt resonators have an interdigital transducer (IDT) with a wider duty factor (DF) than one or more (e.g., all, fewer than all) of the series resonators, to thereby tune the TCF values to improve a lower skirt TCF of the filter device (e.g., synchronize the TCF of the resonant and anti-resonant frequencies for the series resonators and shunt resonators).

In accordance with one aspect of the disclosure, an acoustic filter device (e.g., ladder filter device) is provided having one or more resonators connected in series ("series resonators") and one or more resonators connected in parallel and connected to ground ("parallel resonators" or "shunt resonators"). One or more (e.g., all, fewer than all) of the shunt resonators are covered by a film of positive temperature coefficient of frequency (TCF) material having a first thickness and one or more (e.g., all, fewer than all) of the series resonators are covered by a film of positive temperature coefficient of frequency (TCF) material of a second thickness larger than the first thickness, and one or more (e.g., all, fewer than all, one, two) of the series resonators have an interdigital transducer (IDT) with a wider duty factor (DF) than one or more (e.g., all, fewer than all) of the shunt resonators, to thereby tune the TCF values to improve a lower skirt TCF of the filter device (e.g., synchronize the TCF of the resonant and anti-resonant frequencies for the series resonators and shunt resonators).

In accordance with one aspect of the disclosure, an acoustic wave filter is provided. The acoustic waive filter comprises a substrate and a piezoelectric layer disposed over the substrate. A first plurality of acoustic wave resonators is disposed over the piezoelectric layer and arranged in series along a first branch, each of the first plurality of acoustic wave resonators comprising an interdigital transducer electrode interposed between a pair of reflectors. A second plurality of acoustic wave resonators is disposed over the piezoelectric layer and arranged in parallel, each of the second plurality of acoustic wave resonators comprising an interdigital transducer electrode interposed between a pair of reflectors and being connected to the first branch and to ground. A layer of negative temperature coefficient of frequency dielectric material is disposed over one or more of the second plurality of acoustic wave resonators.

In accordance with another aspect of the disclosure, a radio frequency module is provided. The radio frequency module comprises a package substrate and an acoustic wave filter configured to filter a radio frequency signal. The acoustic wave filter includes a substrate, and a piezoelectric layer over the substrate. A first plurality of acoustic wave resonators is disposed over the piezoelectric layer and arranged in series along a first branch, each of the first plurality of acoustic wave resonators comprising an interdigital transducer electrode interposed between a pair of reflectors. A second plurality of acoustic wave resonators is disposed over the piezoelectric layer and arranged in parallel, each of the second plurality of acoustic wave resonators comprising an interdigital transducer electrode interposed between a pair of reflectors and being connected to the first branch and to ground. A layer of negative temperature coefficient of frequency dielectric material is disposed over one or more of the second plurality of acoustic wave resonators. Additional circuitry and the acoustic wave filter are disposed on the package substrate.

In accordance with another aspect of the disclosure, a wireless communication device is provided. The wireless communication device comprises an antenna and a front end module including an acoustic wave filter configured to filter a radio frequency signal associated with the antenna. The acoustic wave filter includes a substrate, and a piezoelectric layer over the substrate. A first plurality of acoustic wave resonators is disposed over the piezoelectric layer and arranged in series along a first branch, each of the first plurality of acoustic wave resonators comprising an interdigital transducer electrode interposed between a pair of reflectors. A second plurality of acoustic wave resonators is disposed over the piezoelectric layer and arranged in parallel, each of the second plurality of acoustic wave resonators comprising an interdigital transducer electrode interposed between a pair of reflectors and being connected to the first branch and to ground. A layer of negative temperature coefficient of frequency dielectric material is disposed over one or more of the second plurality of acoustic wave resonators.

In accordance with another aspect of the disclosure, an acoustic wave filter is provided. The acoustic waive filter comprises a substrate and a piezoelectric layer disposed over the substrate. A first plurality of acoustic wave resonators is disposed over the piezoelectric layer and arranged in series along a first branch, each of the first plurality of acoustic wave resonators comprising an interdigital transducer electrode interposed between a pair of reflectors. A second plurality of acoustic wave resonators is disposed over the piezoelectric layer and arranged in parallel, each of the second plurality of acoustic wave resonators comprising an interdigital transducer electrode interposed between a pair of reflectors and being connected to the first branch and to ground. A layer of positive temperature coefficient of frequency dielectric material is disposed over one or more of the first plurality of acoustic wave resonators.

In accordance with another aspect of the disclosure, a radio frequency module is provided. The radio frequency module comprises a package substrate and an acoustic wave filter configured to filter a radio frequency signal. The acoustic wave filter includes a substrate, and a piezoelectric layer over the substrate. A first plurality of acoustic wave resonators is disposed over the piezoelectric layer and arranged in series along a first branch, each of the first plurality of acoustic wave resonators comprising an interdigital transducer electrode interposed between a pair of reflectors. A second plurality of acoustic wave resonators is disposed over the piezoelectric layer and arranged in parallel, each of the second plurality of acoustic wave resonators comprising an interdigital transducer electrode interposed between a pair of reflectors and being connected to the first branch and to ground. A layer of positive temperature coefficient of frequency dielectric material is disposed over one or more of the first plurality of acoustic wave resonators. Additional circuitry and the acoustic wave filter are disposed on the package substrate.

In accordance with another aspect of the disclosure, a wireless communication device is provided. The wireless communication device comprises an antenna and a front end module including an acoustic wave filter configured to filter a radio frequency signal associated with the antenna. The acoustic wave filter includes a substrate, and a piezoelectric layer over the substrate. A first plurality of acoustic wave resonators is disposed over the piezoelectric layer and arranged in series along a first branch, each of the first plurality of acoustic wave resonators comprising an interdigital transducer electrode interposed between a pair of reflectors. A second plurality of acoustic wave resonators is disposed over the piezoelectric layer and arranged in parallel, each of the second plurality of acoustic wave resonators comprising an interdigital transducer electrode interposed between a pair of reflectors and being connected to the first branch and to ground. A layer of positive temperature coefficient of frequency dielectric material is disposed over one or more of the first plurality of acoustic wave resonators.

In accordance with another aspect of the disclosure, an acoustic wave filter is provided. The acoustic waive filter comprises a substrate and a piezoelectric layer disposed over the substrate. A first plurality of acoustic wave resonators is disposed over the piezoelectric layer and arranged in series along a first branch, each of the first plurality of acoustic wave resonators comprising an interdigital transducer electrode interposed between a pair of reflectors. A second plurality of acoustic wave resonators is disposed over the piezoelectric layer and arranged in parallel, each of the second plurality of acoustic wave resonators comprising an interdigital transducer electrode interposed between a pair of reflectors and being connected to the first branch and to ground. The interdigital transducer electrode of one or more of the second plurality of acoustic wave resonators has a wider duty factor than the interdigital transducer electrode of the first plurality of acoustic wave resonators.

In accordance with another aspect of the disclosure, a radio frequency module is provided. The radio frequency module comprises a package substrate and an acoustic wave filter configured to filter a radio frequency signal. The acoustic wave filter includes a substrate, and a piezoelectric layer over the substrate. A first plurality of acoustic wave resonators is disposed over the piezoelectric layer and arranged in series along a first branch, each of the first plurality of acoustic wave resonators comprising an interdigital transducer electrode interposed between a pair of reflectors. A second plurality of acoustic wave resonators is disposed over the piezoelectric layer and arranged in parallel, each of the second plurality of acoustic wave resonators comprising an interdigital transducer electrode interposed between a pair of reflectors and being connected to the first branch and to ground. The interdigital transducer electrode of one or more of the second plurality of acoustic wave resonators has a wider duty factor than the interdigital transducer electrode of the first plurality of acoustic wave resonators. Additional circuitry and the acoustic wave filter are disposed on the package substrate.

In accordance with another aspect of the disclosure, a wireless communication device is provided. The wireless communication device comprises an antenna and a front end module including an acoustic wave filter configured to filter a radio frequency signal associated with the antenna. The acoustic wave filter includes a substrate, and a piezoelectric layer over the substrate. A first plurality of acoustic wave resonators is disposed over the piezoelectric layer and arranged in series along a first branch, each of the first plurality of acoustic wave resonators comprising an interdigital transducer electrode interposed between a pair of reflectors. A second plurality of acoustic wave resonators is disposed over the piezoelectric layer and arranged in parallel, each of the second plurality of acoustic wave resonators comprising an interdigital transducer electrode interposed between a pair of reflectors and being connected to the first branch and to ground. The interdigital transducer electrode of one or more of the second plurality of acoustic wave resonators has a wider duty factor than the interdigital transducer electrode of the first plurality of acoustic wave resonators.

BRIEF DESCRIPTION OF THE DRAWINGS

Embodiments of this disclosure will now be described, by way of non-limiting example, with reference to the accompanying drawings.

FIG. 9 is a graph of frequency response for the acoustic wave device of FIG. 5 at different temperatures, the frequency normalized relative to the center passband frequency.

FIG. 10A shows a graphs of TCF versus cut angle for a series resonator of the acoustic wave device of FIG. 5.

FIG. 10B shows a graphs of TCF versus cut angle for a parallel or shunt resonator of the acoustic wave device of FIG. 5.

DETAILED DESCRIPTION

Figure 1:
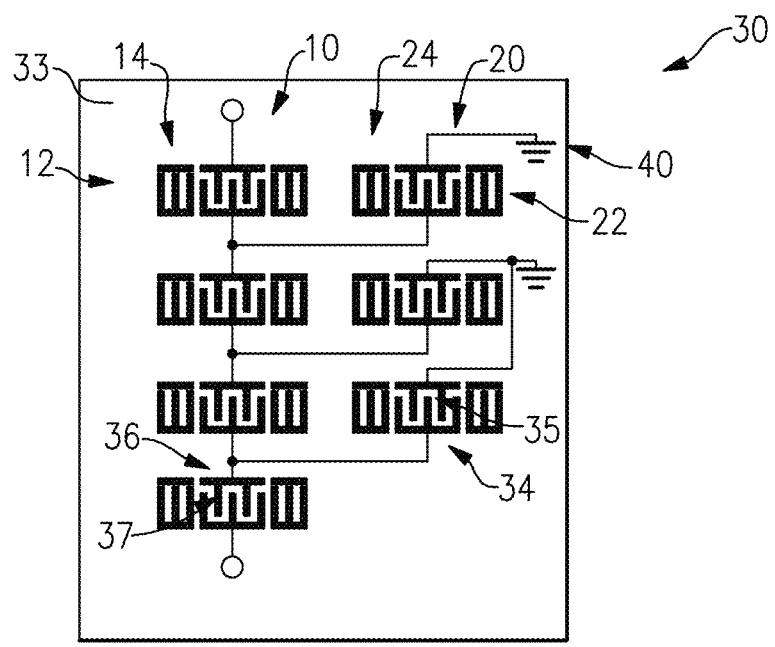
FIG. 1 is a schematic top view of an acoustic wave device.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic top view of an acoustic wave device 30. In one implementation, the acoustic wave device is a ladder filter with one or more resonators 12 arranged in a series 10 (e.g., series resonators 12 on a series arm) and one or more resonators 22 arranged in parallel 20 (e.g., in parallel arm(s)). The one or more resonators 22 connect to ground 40 so the one or more resonators 22 can be shunt resonators 22 and the one or more parallel arms can be shunt arms. Each of the resonators 22 can include an interdigital transducer (IDT) electrode 34 with a plurality of fingers 35 and reflectors 24 on opposite sides of the IDT electrode 34. Similarly, each of the resonators 12 can include an interdigital transducer (IDT) electrode 36 with a plurality of fingers 37 and reflectors 14 on opposite sides of the IDT electrode 36. In one implementation, the resonators 12, 22 are surface acoustic wave (SAW) resonators. However, in other implementations, the resonators 12, 22 can be a bulk acoustic wave (BAW) resonators. In the illustrated implementation, the resonators 12, 22 are identical.

Figure 2:
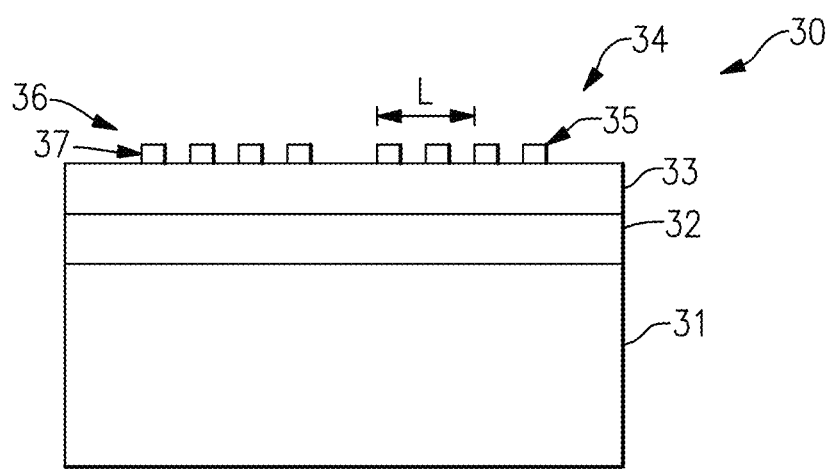
FIG. 2 is a schematic cross-sectional view of the acoustic wave device of FIG. 1.

FIG. 2 shows a schematic cross-sectional view of the acoustic wave device 30. The acoustic wave device 30 can have a multilayer piezoelectric substrate structure. As shown in FIG. 2, the acoustic wave device 30 includes a substrate structure (e.g., substrate, layer) 31, an additional structure (e.g., substrate, functional layer) 32 over (e.g., disposed over, disposed adjacent to, disposed in contact with) the substrate structure 31, a piezoelectric structure (e.g., layer) 33 over (e.g., disposed over, disposed adjacent to, disposed in contact with) the additional structure 32, and interdigital transducer (IDT) electrodes 34, 36 with fingers 35, 37, respectively, over (e.g., disposed over, disposed adjacent to, disposed in contact with) the piezoelectric structure 33. For simplicity, FIG. 2 shows a partial view of the IDT electrodes 34, 36, showing portions representing the fingers 35, 37 of the IDT electrodes 34, 36 of the acoustic wave device 30 (e.g., ladder filter). In some implementations, the additional structure (e.g., substrate, functional layer) 32 is excluded (e.g., the piezoelectric structure or layer 33 is disposed over, adjacent to and/or in contact with the substrate structure or layer 31).

The piezoelectric layer 33 can be a lithium based piezoelectric layer. For example, the piezoelectric layer 33 can be a lithium tantalate (LiTaO3) layer. As another example, the piezoelectric layer 33 can be a lithium niobate (LiNbO3) layer. The piezoelectric layer 33 has a negative temperature coefficient of frequency (TCF). The IDT electrode 34, 36 can include Aluminum (Al), molybdenum (Mo), tungsten (W), gold (Au), silver (Ag), copper (Cu), platinum (Pt), ruthenium (Ru), titanium (Ti), the like, or any suitable combination thereof. In some implementations, the IDT electrode 34, 36 can be a multi-layer IDT. For example, the IDT electrode 34, 36 can have a first layer of Aluminum, and a second layer of molybdenum. In another example, the IDT electrode 34, 36 can have a first layer of Aluminum, and a second layer of tungsten. In another example, the IDT electrode 34, 36 can have a first layer of Aluminum, and a second layer of platinum. In some implementations, the IDT electrode 34, 36, whether single later or multi-layer, can be covered by a dielectric layer, such as of silicon dioxide (SiO2) and/or have a protective layer, such as of silicon nitride (SiN).

The additional structure (e.g., layer, functional layer) 32 can have a lower acoustic impedance than the substrate structure (e.g., layer) 31. The additional structure (e.g., layer) 32 can increase adhesion between the substrate structure 31 and the piezoelectric structure 33 of the multi-layer piezoelectric substrate. Alternatively or additionally, the additional structure (e.g., layer) 32 can increase heat dissipation in the SAW device 30 relative to the SAW device 20. The additional or functional layer 32 can be made of silicon dioxide (SiO2).

In one implementation, the substrate structure (e.g., layer) 31 can be formed or provided. The additional layer or structure (e.g., functional layer) 32 can be formed or provided (e.g., disposed on, attached or adhered to the substrate structure 31). The piezoelectric structure (e.g., layer) 33 can be formed or provided (e.g., disposed on, attached or adhered to the additional layer 32). The IDT electrodes 34, 36 can be formed or provided (e.g., disposed on, attached or adhered to the piezoelectric structure or layer 33).

Figure 3:
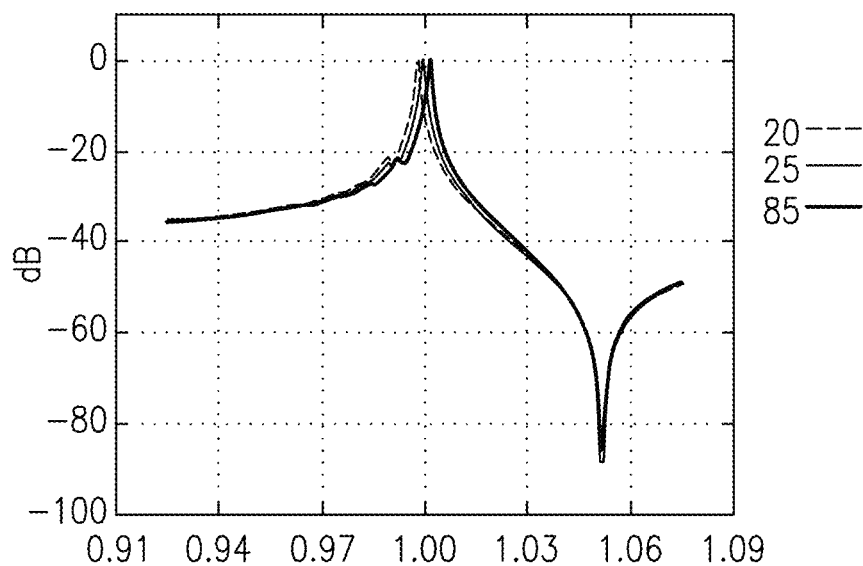
FIG. 3 is a graph of frequency response for a resonator of the acoustic wave device in FIG. 1 at different temperatures, the frequency normalized relative to the resonant frequency.
Figure 4:
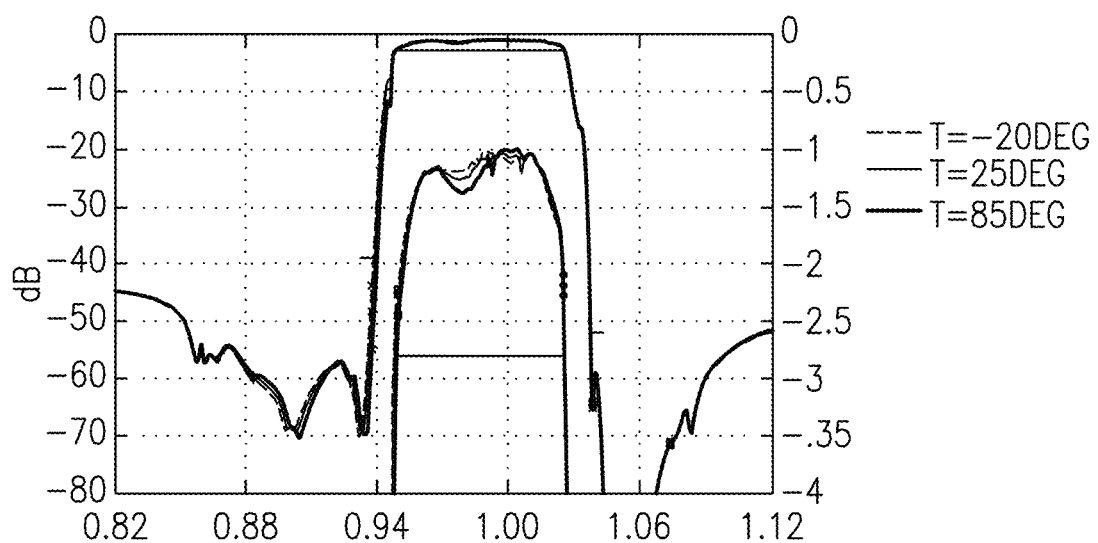
FIG. 4 is a graph of frequency response for the acoustic wave device of FIG. 1 at different temperatures, the frequency normalized relative to the center passband frequency.

FIG. 3 shows the frequency response for the resonators 12 (e.g., series resonators 12), normalized relative to the resonant frequency. The graph of FIG. 3 shows that the anti-resonant frequency has a near zero temperature coefficient of frequency (TCF), but the resonant frequency has a positive temperature coefficient of frequency (TCF) —that is it increases in electrical resistance with increased temperature. FIG. 4 shows the frequency response for the acoustic wave device 30, normalized relative to the passband center frequency. The upper edge of the band or higher slope TCF is almost zero, whereas the lower edge of the band or lower slope TCF is worse because the resonant frequency TCF for the resonators 12 has a positive value. This can lead to degraded attenuation for the acoustic wave device 30 a lower temperatures.

Figure 5:
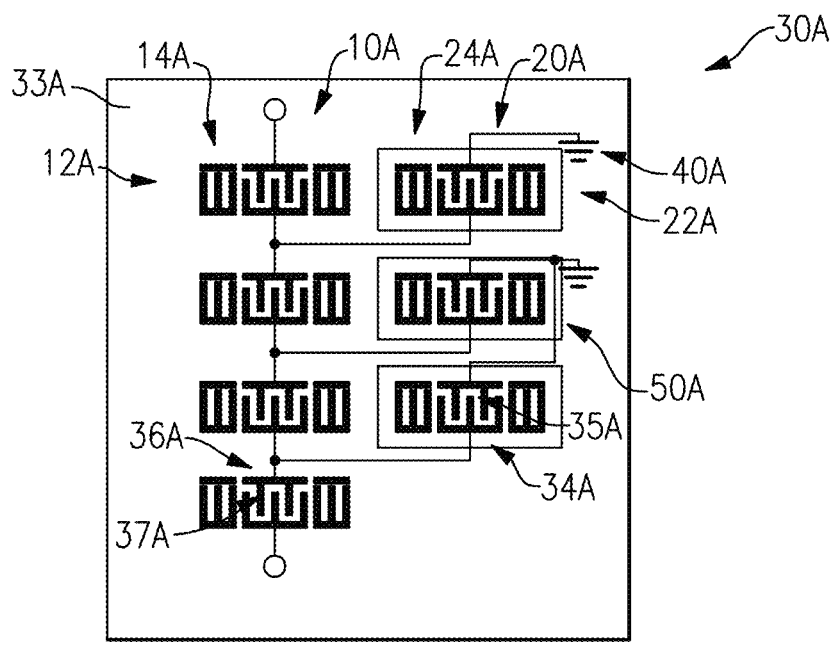
FIG. 5 is a schematic top view of an acoustic wave device.
Figure 6:
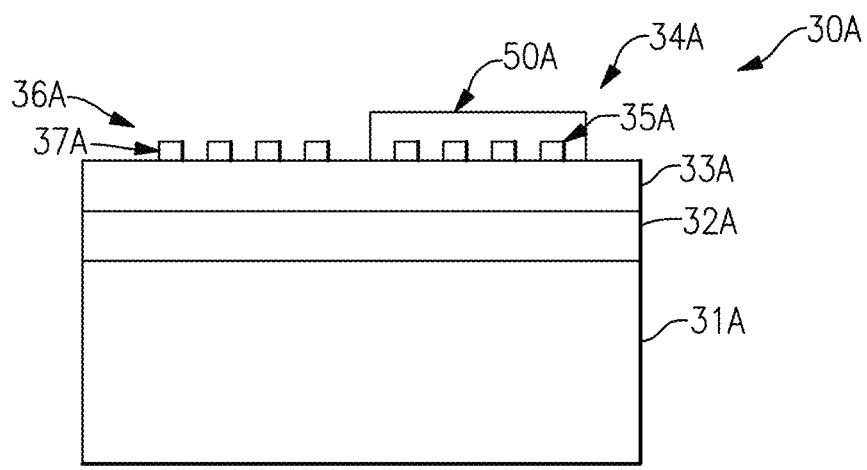
FIG. 6 is a schematic cross-sectional view of the acoustic wave device of FIG. 5.

FIGS. 5-6 show an acoustic wave device 30A. The acoustic wave device 30A is similar to the acoustic wave device 30 of FIGS. 1-2. Thus, reference numerals used to designate the various components of the acoustic wave device 30A are identical to those used for identifying the corresponding components of the acoustic wave device 30 in FIGS. 1-2, except that an "A" has been added to the numerical identifier. Therefore, the structure and description for the various features and components of the acoustic wave device 30 in FIGS. 1-2 are understood to also apply to the corresponding features of the acoustic wave device 30A in FIGS. 5-6, except as described below.

The acoustic wave device 30A differs from the acoustic wave device 30 in FIGS. 1-2 in that the resonators 22A (e.g., shunt resonators 22A) are covered (e.g., the IDT electrode 34A and reflectors 24A are covered) with a film 50A (e.g., one or more layer(s), structure) of negative temperature coefficient of frequency (TCF) dielectric material. The resonators 12A (e.g., series resonators 12A) are uncovered (e.g., not covered by a film or layer, for example of negative TCF dielectric material). In one example, the film 50A can be of silicon nitride (SiN). In another example, the film 50A can be of zinc oxide (ZnO). In another example, the film 50A can be of silicon oxynitride (SiON). However, the film 50A can be of other suitable materials with negative TCF. In the illustrated implementation, each of the resonators 22A is covered by a separate film 50A. In another implementation, two or more (e.g., all) of the resonators 22A (e.g., shunt resonators 22A) are covered by the same film 50A. The film 50A can be formed or provided (e.g., disposed on, attached or adhered to the piezoelectric structure or layer 33 and the IDT electrode 34A and reflectors 24A). The film 50A can be etched or otherwise machined to a desired height above the piezoelectric structure or layer 33.

The substrate structure or layer 31A can include (e.g., be made of, consist of) silicon (Si). In another example, the substrate structure or layer 31A can be made of poly-silicon. In another example, the substrate structure or layer 31A can be made of amorphous silicon. In another example, the substrate structure or layer 31A can be made of silicon nitride (SiN). In another example, the substrate structure or layer 31A can be made of Sapphire. In another example, the substrate structure or layer 31A can be made of quartz. In another example, the substrate structure or layer 31A can be made of aluminum nitride (AlN). In another example, the substrate structure or layer 31A can be made of polycrystalline ceramic ($Mg_2O_4$). In another implementation, the substrate structure or layer 31A can be made of diamond. However, the substrate structure or layer 31A can be made of other suitable high impedance materials. An acoustic impedance of the substrate structure 31A can be higher than an acoustic impedance of the piezoelectric structure (e.g., layer) 33A.

Figure 7:
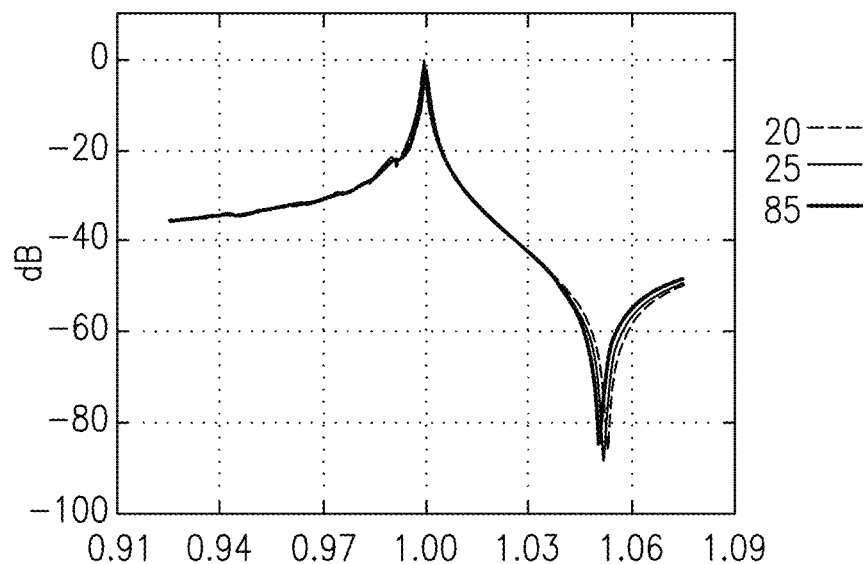
FIG. 7 is a graph of frequency response for a resonator of the acoustic wave device in FIG. 5 at different temperatures, the frequency normalized relative to the resonant frequency.
Figure 8:
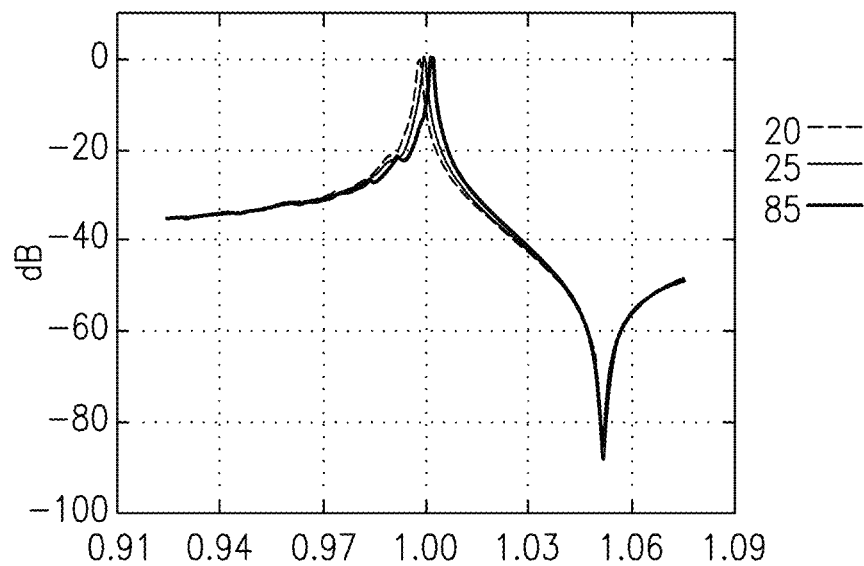
FIG. 8 is a graph of frequency response for a resonator of the acoustic wave device in FIG. 5 at different temperatures, the frequency normalized relative to the resonant frequency.

FIG. 7 shows the frequency response for the resonators 22A, normalized relative to the resonant frequency. The graph of FIG. 7 shows that the resonant frequency has a near zero temperature coefficient of frequency (TCF), but the anti-resonant frequency has a negative temperature coefficient of frequency (TCF) —that is it decreases in electrical resistance with increased temperature. FIG. 8 shows the frequency response for the resonators 12A (e.g., series resonators 12A), normalized relative to the resonant frequency. The graph of FIG. 8 shows that the resonant frequency has a positive temperature coefficient of frequency (TCF), but the anti-resonant frequency has a near zero temperature coefficient of frequency (TCF). FIG. 9 shows the frequency response for the acoustic wave device 30A, normalized relative to the passband center frequency. The graph of FIG. 9 shows that the upper edge of the band or higher slope TCF is almost zero, whereas the lower edge of the band or lower slope TCF is improved (e.g., is closer to zero TCF so does not vary with temperature). Accordingly, the acoustic wave device 30A has improved temperature stability relative to the acoustic wave device 30 (e.g., adjusts or tunes the TCF of the resonant and anti-resonant frequency to be substantially the same).

FIGS. 10A and 10B show graphs of temperature coefficient of frequency (TCF) for the series resonators 12A (TCFs) and for the parallel or shunt resonators 22A (TCFp) where the additional layer or structure (e.g., functional layer) 32 is made of silicon dioxide ($SiO_2$) and has a thickness of 0.3 L, where L is the pitch between the fingers 35A, 37A of the IDTs 34A, 36A. The graphs show that TCFs and TCFp vary with the thickness of the piezoelectric structure or layer 33A, where the piezoelectric structure or layer is made of lithium tantalate (LiTaO3). As shown in the graphs, TCFs is higher than TCFp, and the TCFs values for the series resonators 12A become positive when the thickness of the piezoelectric structure or layer 33A becomes thinner than 0.3 L.

Figure 11B:
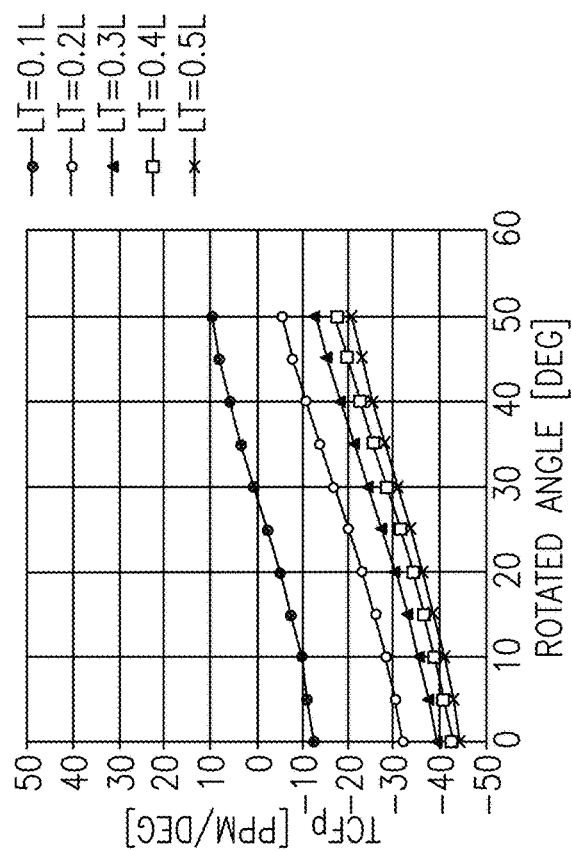
FIG. 11B shows a graphs of TCF versus cut angle for a parallel or shunt resonator of the acoustic wave device of FIG. 5.
Figure 11A:
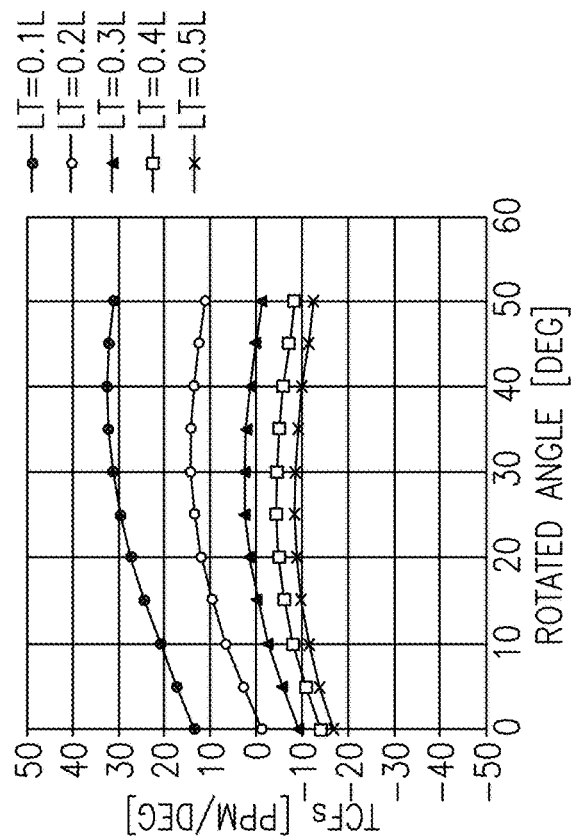
FIG. 11A shows a graphs of TCF versus cut angle for a series resonator of the surface wave device of FIG. 5.

FIGS. 11A and 11B show graphs of temperature coefficient of frequency (TCF) for the series resonators 12A (TCFs) and for the parallel or shunt resonators 22A (TCFp) where the additional layer or structure (e.g., functional layer) 32 is made of silicon dioxide ($SiO_2$) and has a thickness of 0.2 L, where L is the pitch between the fingers 35A, 37A of the IDTs 34A, 36A. The graphs show that TCFs and TCFp vary with the thickness of the piezoelectric structure or layer 33A, where the piezoelectric structure or layer is made of lithium tantalate (LiTaO3). As shown in the graphs, TCFs is higher than TCFp, and the TCFs values for the series resonators 12A become positive when the thickness of the piezoelectric structure or layer 33A becomes thinner than 0.3 L.

Figure 12:
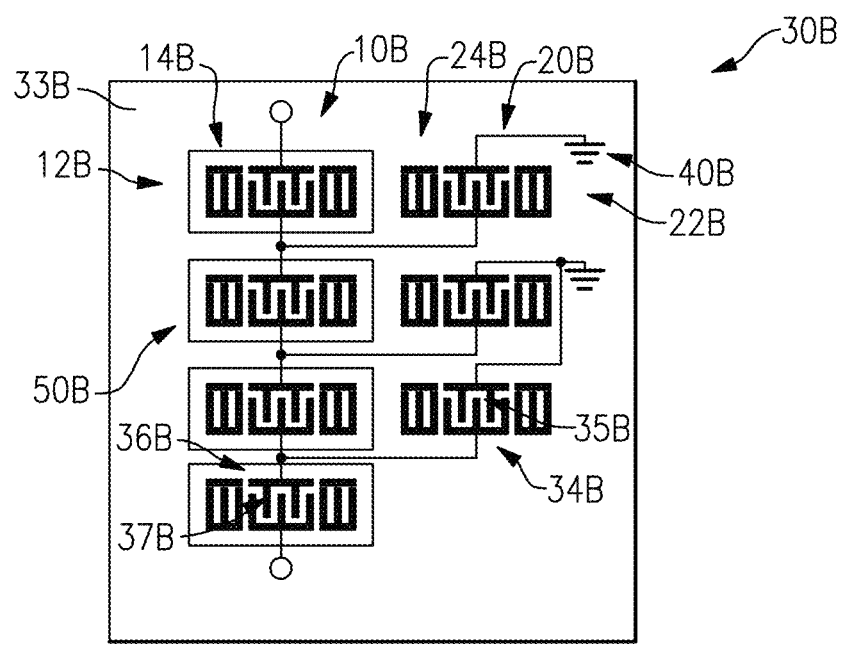
FIG. 12 is a schematic top view of an acoustic wave device.
Figure 13:
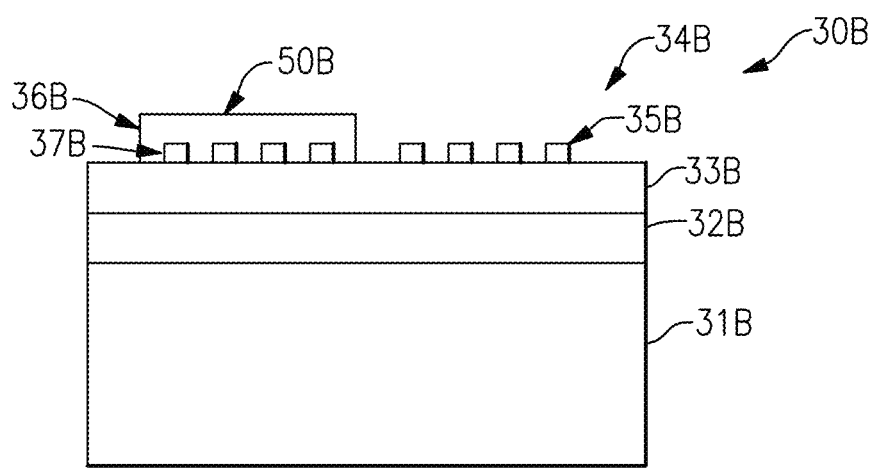
FIG. 13 is a schematic cross-sectional view of the acoustic wave device of FIG. 12.

FIGS. 12-13 show an acoustic wave device 30B. The acoustic wave device 30B is similar to the acoustic wave device 30A of FIGS. 5-6. Thus, reference numerals used to designate the various components of the acoustic wave device 30B are identical to those used for identifying the corresponding components of the acoustic wave device 30A in FIGS. 5-6, except that a "B" instead of an "A" has been added to the numerical identifier. Therefore, the structure and description for the various features and components of the acoustic wave device 30A in FIGS. 5-6 (which is based on the structure and description for the acoustic wave device 30 in FIGS. 1-2) are understood to also apply to the corresponding features of the acoustic wave device 30B in FIGS. 12-13, except as described below.

The acoustic wave device 30B differs from the acoustic wave device 30A in FIGS. 5-6 in that the resonators 12B (e.g., series resonators 12B) are covered (e.g., the IDT 36B and reflectors 14B are covered) with a film 50B of positive temperature coefficient of frequency (TCF) dielectric material, and the resonators 22B (e.g., shunt resonators 22B) are uncovered (e.g., the IDT 34B and reflectors 24B are not covered with a film, for example, of negative or positive TCF dielectric material). In one example, the film 50B can be of silicon dioxide ($SiO_2$). In the illustrated implementation, each of the resonators 12B is covered by a separate film 50B of positive TCF material. In another implementation, two or more (e.g., all) of the resonators 12B (e.g., series resonators 12B) are covered by the same film 50B of positive TCF material. Covering the series resonators 12B with the film 50B of positive TCF material has a similar effect as covering the shunt resonators 22A with the film 50A of negative TCF material—that is, it improves the temperature stability of the acoustic wave device 30B (e.g., synchronizes the resonant and anti-resonant TCF on each of the series resonators 12B and shunt resonators 22B).

Figure 14:
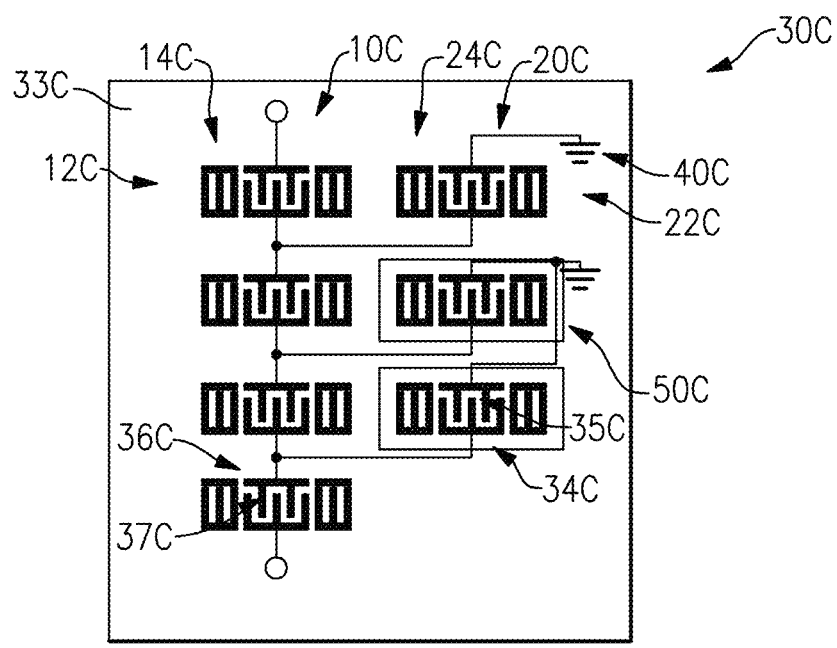
FIG. 14 is a schematic top view of an acoustic wave device.
Figure 15:
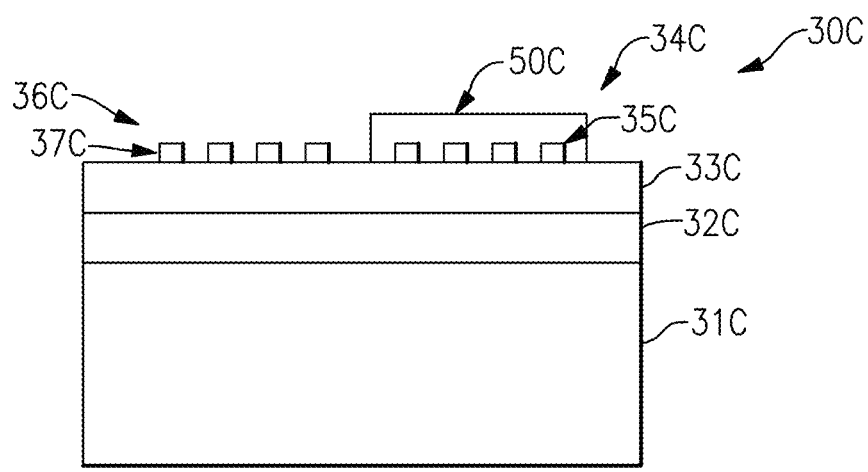
FIG. 15 is a schematic cross-sectional view of the acoustic wave device of FIG. 14.

FIGS. 14-15 show an acoustic wave device 30C. The acoustic wave device 30C is similar to the acoustic wave device 30A of FIGS. 5-6. Thus, reference numerals used to designate the various components of the acoustic wave device 30C are identical to those used for identifying the corresponding components of the acoustic wave device 30A in FIGS. 5-6, except that a "C" instead of an "A" has been added to the numerical identifier. Therefore, the structure and description for the various features and components of the acoustic wave device 30A in FIGS. 5-6 (which is based on the structure and description for the acoustic wave device 30 in FIGS. 1-2) are understood to also apply to the corresponding features of the acoustic wave device 30C in FIGS. 14-15, except as described below.

The acoustic wave device 30C differs from the acoustic wave device 30A in FIGS. 5-6 in that not all of the shunt resonators 22C are covered by the film 50C of negative TCF dielectric material (e.g., one or more of the shunt resonators 22C are covered by the film 50C). In the illustrated example, one shunt resonator 22C is not covered by the film 50C and the other two shunt resonators 22C are covered by the film 50 of negative TCF material. The resonators 12C (e.g., series resonators 12C) are uncovered (e.g., not covered by a film or layer, for example of negative TCF dielectric material). Covering some (but not all) of the shunt resonators 22C with the negative TCF material film 50C results in an improved temperature stability of the acoustic wave device 30C as compared to the acoustic wave device 30 (e.g., adjusts or tunes the TCF of the resonant and anti-resonant frequency to be approximately the same).

Figure 16:
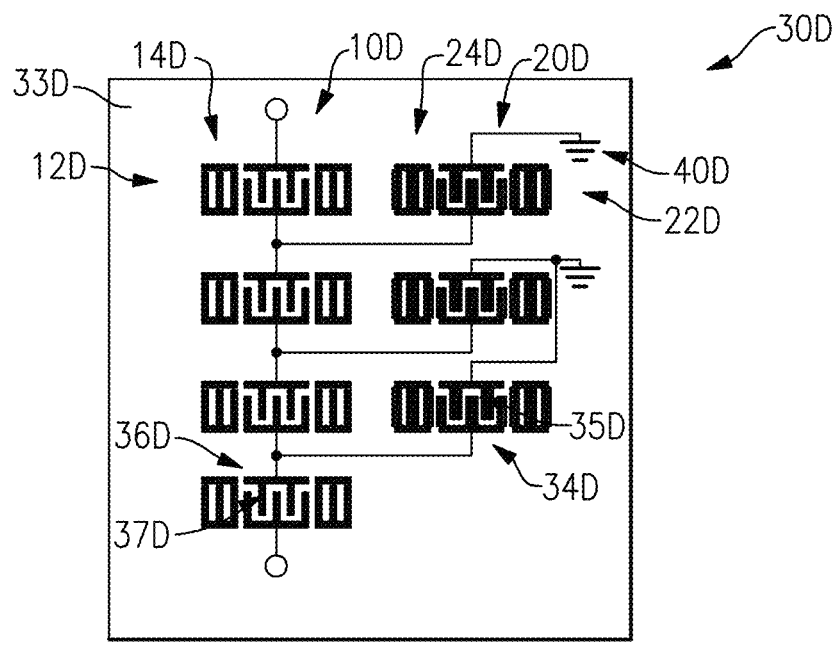
FIG. 16 is a schematic top view of an acoustic wave device.
Figure 17:
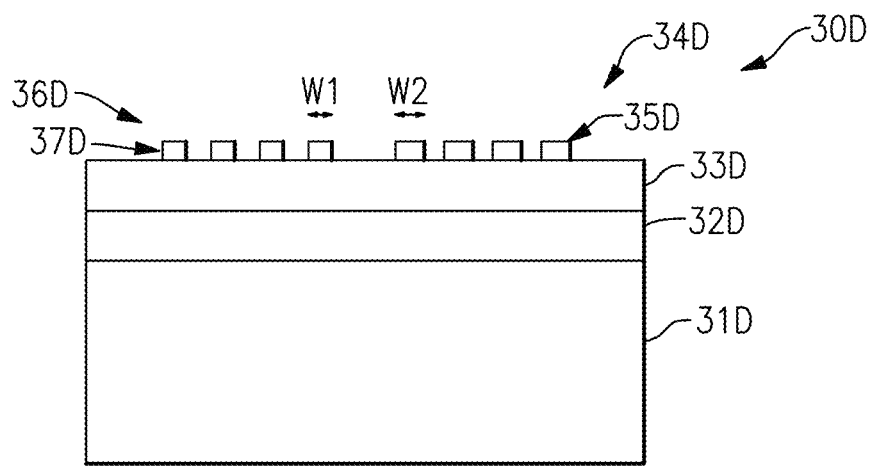
FIG. 17 is a schematic cross-sectional view of the acoustic wave device of FIG. 16.

FIGS. 16-17 show an acoustic wave device 30D. The acoustic wave device 30D is similar to the acoustic wave device 30 of FIGS. 1-2. Thus, reference numerals used to designate the various components of the acoustic wave device 30D are identical to those used for identifying the corresponding components of the acoustic wave device 30 in FIGS. 1-2, except that a "D" has been added to the numerical identifier. Therefore, the structure and description for the various features and components of the acoustic wave device 30 in FIGS. 1-2 are understood to also apply to the corresponding features of the acoustic wave device 30D in FIGS. 16-17, except as described below.

The acoustic wave device 30D differs from the acoustic wave device 30 in FIGS. 1-2 in that one or more of the shunt resonators 22D have an IDT electrode 34D with fingers 35D that have a width W2 that is greater than a width W1 of the fingers 37D of the IDT electrode 36D of the series resonators 12D. Accordingly, one or more of the shunt resonators 22D have a wider duty factor (DF) than the series resonators 12D. The resonators 12D (e.g., series resonators 12D) and resonators 22D (e.g., shunt resonators 22D) are uncovered (e.g., not covered by a film or layer of positive or negative TCF dielectric material). The material of the IDT electrodes 34D (e.g., metal) has a negative temperature coefficient of frequency (TCF), so the one or more shunt resonators 22D with the wider duty factor (DF) have a higher negative TCF value, which results in an improved temperature stability of the acoustic wave device 30D as compared to the acoustic wave device 30 (e.g., adjusts or tunes the TCF of the resonant and anti-resonant frequency to be approximately the same). In another implementation, a similar effect is provided by having one or more of the shunt resonators 22D have an IDT electrode 34D with fingers 35D that have a width W2 that is smaller than a width W1 of the fingers 37D of the IDT electrode 36D of the series resonators 12D.

Figure 18:
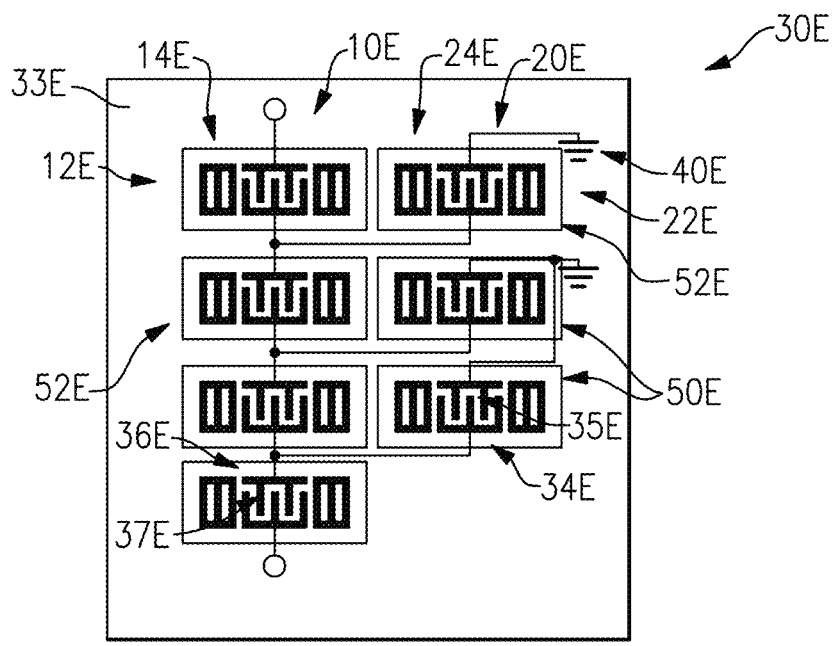
FIG. 18 is a schematic top view of an acoustic wave device.
Figure 19:
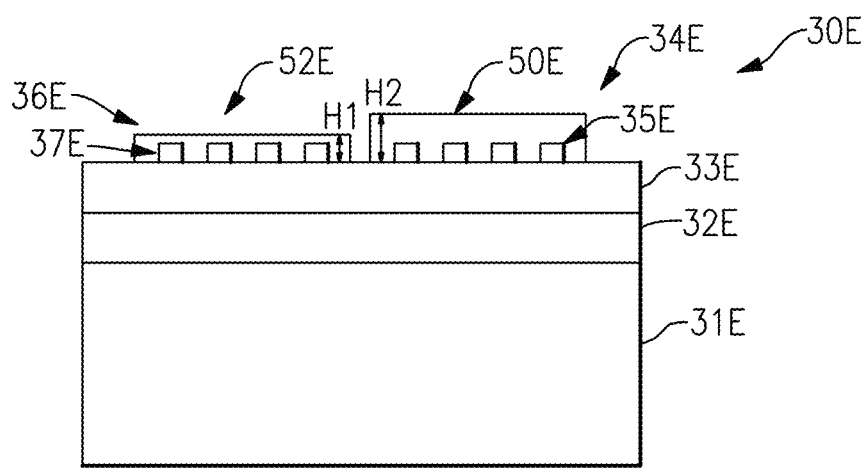
FIG. 19 is a schematic cross-sectional view of the acoustic wave device of FIG. 18.

FIGS. 18-19 show an acoustic wave device 30E. The acoustic wave device 30E is similar to the acoustic wave device 30C of FIGS. 14-15. Thus, reference numerals used to designate the various components of the acoustic wave device 30E are identical to those used for identifying the corresponding components of the acoustic wave device 30C in FIGS. 14-15, except that an "E" instead of a "C" has been added to the numerical identifier. Therefore, the structure and description for the various features and components of the acoustic wave device 30C in FIGS. 14-15 (which is based on the structure and description for the acoustic wave device 30 in FIGS. 1-2) are understood to also apply to the corresponding features of the acoustic wave device 30E in FIGS. 18-19, except as described below.

The acoustic wave device 30E differs from the acoustic wave device 30C in FIGS. 14-15 in that the series resonators 12E and at least one of the shunt resonators 22E are covered by the film 52E of negative TCF dielectric material having a height or thickness H2 that is smaller than a height or thickness H1 of the film 50E of negative TCF dielectric material that covers the remaining shunt resonators 22E. In the illustrated implementation, each of the series resonators 12E is covered by a separate film 52E and each of the shunt resonators 22E is covered by a separate film 50E or 52E. In another implementation, two or more (e.g., all) of the resonators 12E (e.g., series resonators 12E) are covered by the same film 52E and/or two or more (e.g., all) of the resonators 22E (e.g., shunt resonators 22E) are covered by the same film 50E. The greater thickness H1 of the film 50E that covers one or more of the shunt resonators 22E provides them with a higher negative TCF value (e.g., than that for the resonators 12E, 22E covered by the film 52E), which results in an improved temperature stability of the acoustic wave device 30E (e.g., adjusts or tunes the TCF of the resonant and anti-resonant frequency to be approximately the same).

Figure 20:
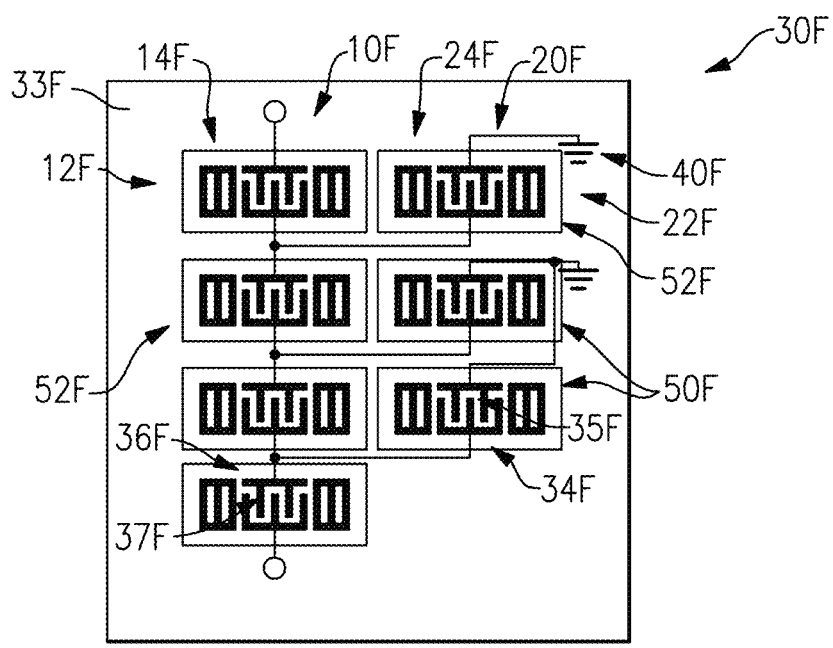
FIG. 20 is a schematic top view of an acoustic wave device.
Figure 21:
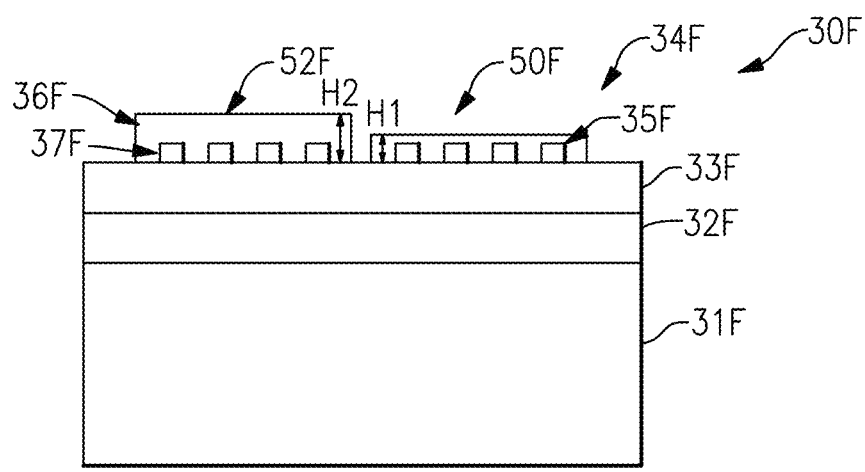
FIG. 21 is a schematic cross-sectional view of the acoustic wave device of FIG. 20.

FIGS. 20-21 show an acoustic wave device 30F. The acoustic wave device 30F is similar to the acoustic wave device 30E of FIGS. 18-19. Thus, reference numerals used to designate the various components of the acoustic wave device 30F are identical to those used for identifying the corresponding components of the acoustic wave device 30E in FIGS. 18-19, except that an "F" instead of a "E" has been added to the numerical identifier. Therefore, the structure and description for the various features and components of the acoustic wave device 30E in FIGS. 18-19 (which is based on the structure and description for the acoustic wave device 30 in FIGS. 1-2) are understood to also apply to the corresponding features of the acoustic wave device 30F in FIGS. 20-21, except as described below.

The acoustic wave device 30F differs from the acoustic wave device 30E in FIGS. 18-19 in that the resonators 12F (e.g., series resonators 12F) and at least one shunt resonator 22F are covered (e.g., the IDT 36F and reflectors 14F are covered) with a film 52F of positive temperature coefficient of frequency (TCF) dielectric material, and the remaining resonators 22F (e.g., shunt resonators 22F) are covered (e.g., the IDT 34F and reflectors 24F are covered) with a film 50F of positive temperature coefficient of frequency (TCF) dielectric material. The height or thickness H2 of the film 52F is greater than the height or thickness H1 of the film 50F. Covering the series resonators 12F and at least one shunt resonator 22F with the film 52F of positive TCF dielectric material having thickness H2, and covering the remaining shunt resonators 22F with the film 50F of positive TCF dielectric material having thickness H1 has a similar effect as the films 50E, 52E used for the acoustic wave device 30E—that is, it improves the temperature stability of the acoustic wave device 30F (e.g., synchronizes the resonant and anti-resonant TCF of the series resonators 12F and shunt resonators 22F).

Figure 22:
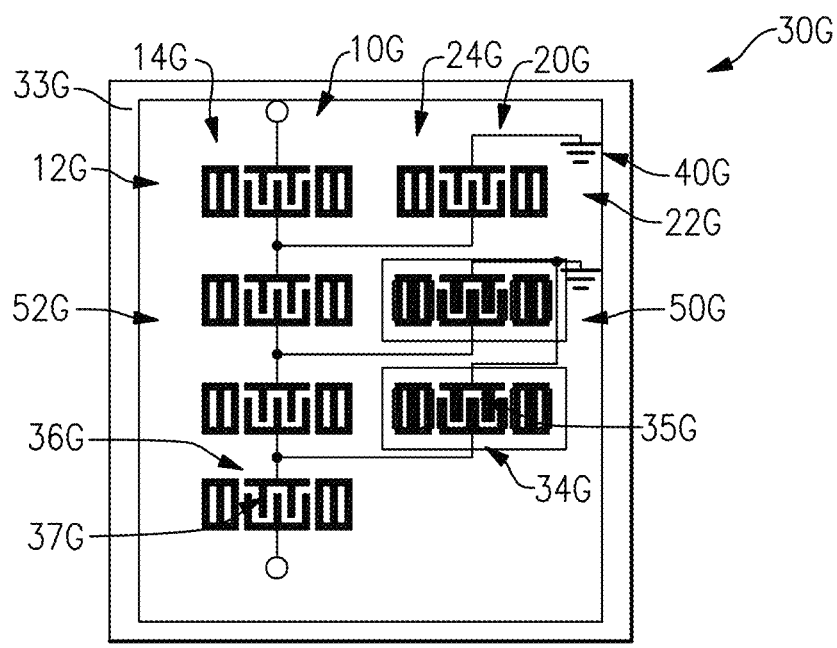
FIG. 22 is a schematic top view of an acoustic wave device.
Figure 23:
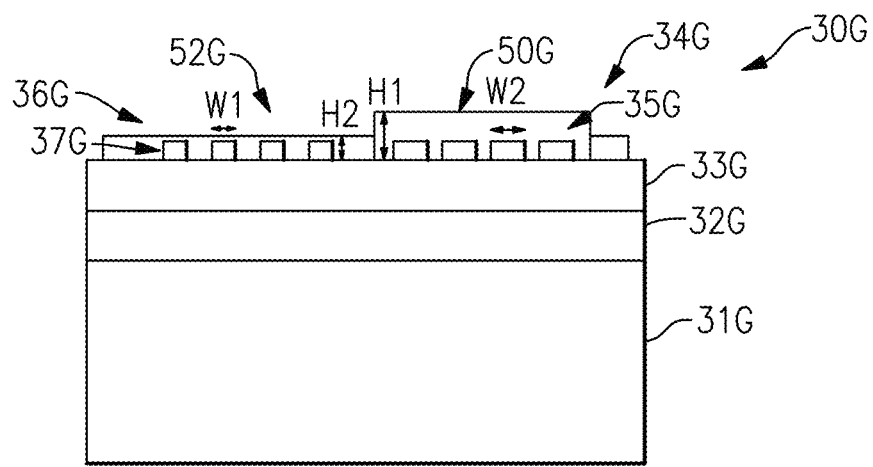
FIG. 23 is a schematic cross-sectional view of the acoustic wave device of FIG. 22.

FIGS. 22-23 show an acoustic wave device 30G. The acoustic wave device 30G is similar to the acoustic wave device 30E of FIGS. 18-19. Thus, reference numerals used to designate the various components of the acoustic wave device 30G are identical to those used for identifying the corresponding components of the acoustic wave device 30E in FIGS. 18-19, except that a "G" instead of a "E" has been added to the numerical identifier. Therefore, the structure and description for the various features and components of the acoustic wave device 30E in FIGS. 18-19 (which is based on the structure and description for the acoustic wave device 30 in FIGS. 1-2) are understood to also apply to the corresponding features of the acoustic wave device 30G in FIGS. 22-23, except as described below.

The acoustic wave device 30G differs from the acoustic wave device 30E in FIGS. 18-19 in that a film 52G of negative TCF dielectric material having a height or thickness H2 covers all of the series resonators 12G and all of the shunt resonators 22G, and an additional film 50G (e.g., or portion, layer or structure) of negative TCF dielectric material covers one or more (e.g., two) of the shunt resonators 22G (e.g., the film 50G extending over the film 52G) so that the negative TCF dielectric material that covers the one or more shunt resonators 22G has a total height or thickness H1 that is greater than the height or thickness H2. Additionally, one or more of the shunt resonators 22G has an IDT electrode 34G with fingers 35G that have a width W2 that is greater than a width W12 of the fingers 37G of the IDT electrode 36G of the series resonators 12G. The material of the IDT electrodes 34G (e.g., metal) has a negative temperature coefficient of frequency (TCF), so the one or more shunt resonators 22G with the wider duty factor (DF) have a higher negative TCF value. The wider duty factor (DF) and the thicker film layer or structure 50G covering the shunt resonators 22G result in an improved temperature stability of the acoustic wave device 30G as compared to the acoustic wave device 30E (e.g., adjusts or tunes the TCF of the resonant and anti-resonant frequency to be approximately the same).

Figure 24:
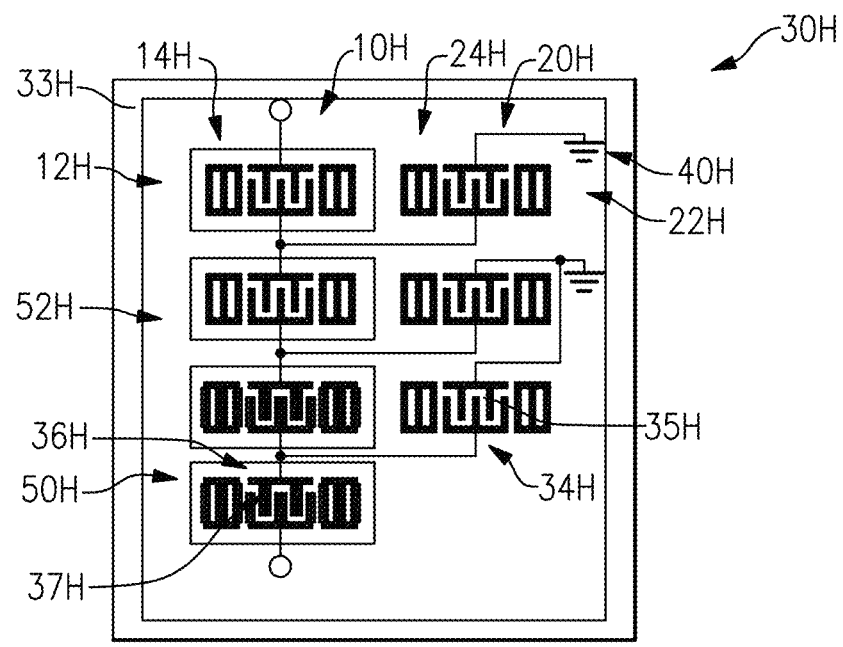
FIG. 24 is a schematic top view of an acoustic wave device.
Figure 25:
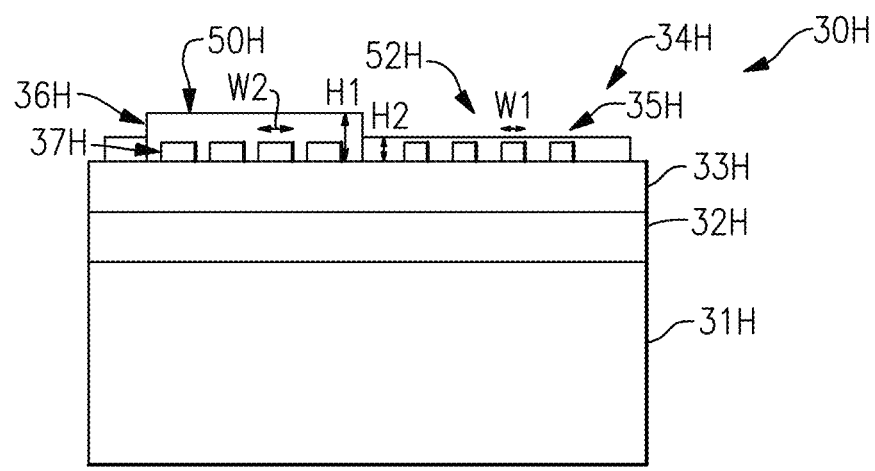
FIG. 25 is a schematic cross-sectional view of the acoustic wave device of FIG. 24.

FIGS. 24-25 show an acoustic wave device 30H. The acoustic wave device 30H is similar to the acoustic wave device 30G of FIGS. 22-23. Thus, reference numerals used to designate the various components of the acoustic wave device 30H are identical to those used for identifying the corresponding components of the acoustic wave device 30G in FIGS. 22-23, except that an "H" instead of a "G" has been added to the numerical identifier. Therefore, the structure and description for the various features and components of the acoustic wave device 30G in FIGS. 22-23 (which is based on the structure and description for the acoustic wave device 30 in FIGS. 1-2) are understood to also apply to the corresponding features of the acoustic wave device 30H in FIGS. 24-25, except as described below.

The acoustic wave device 30F differs from the acoustic wave device 30G in FIGS. 22-23 in that the film 52H with the height or thickness H2 that covers all of the series resonators 12H and all of the shunt resonators 22H is of a positive temperature coefficient of frequency (TCF) dielectric material, and the additional film 50H (e.g., or portion, layer or structure) is of a positive TCF dielectric material and covers one or more of the series resonators 12H (e.g., and does not cover any of the shunt resonators 22H) so that the positive TCF dielectric material that covers the one or more series resonators 12H has a total height or thickness H1 that is greater than the height or thickness H2. One or more of the shunt resonators 22H have an IDT electrode 34H with fingers 35H can have a width W1 that is smaller than a width W2 of the fingers 37H of the IDT electrode 36H of the series resonators 12H.

Covering the series resonators 12H and shunt resonator 22H with the film 52H of positive TCF dielectric material having thickness H2, and covering one or more of the series resonators 12H with the film 50H of positive TCF dielectric material, as well as having at least one of the series resonators 12H have a wider duty factor (DF) than the series resonators 12H, has a similar effect as the films 50G, 52G used for the acoustic wave device 30G—that is, it improves the temperature stability of the acoustic wave device 30H (e.g., synchronizes the resonant and anti-resonant TCF of the series resonators 12H and shunt resonators 22H).

The surface acoustic wave device 30-30H and/or other acoustic wave devices disclosed herein can be included in a band pass filter. The band pass filter can have a passband with a center frequency in a range from 1.5 gigahertz (GHz) to 2.5 GHz. The center frequency can be an arithmetic mean or a geometric mean of a lower cutoff frequency of the passband and an upper cutoff frequency of the passband. The center frequency in a range from 1.5 GHz to 2.2 GHz in certain instances. The passband can have a bandwidth in a range from 5 megahertz (MHz) to 100 MHz in certain applications. The band pass filter can have a passband defined by a communication standard in which the passband is within a frequency range from 1.5 GHz to 2.5 GHz.

In some instances, the surface acoustic wave device 30-30H and/or other acoustic wave devices disclosed herein can be included in a band stop filter having a center frequency in a range from 1.5 GHz to 2.5 GHz. The stop band of the band stop filter can have a bandwidth in a range from 5 MHz to 100 MHz in certain applications.

The acoustic wave devices disclosed herein can be implemented in a variety of packaged modules. An example packaged module will now be described in which any suitable principles and advantages of the acoustic wave resonators disclosed herein can be implemented. A packaged module can include one or more features of the packaged module of FIG. 26 and/or the packaged module of FIG. 27.

Figure 26:
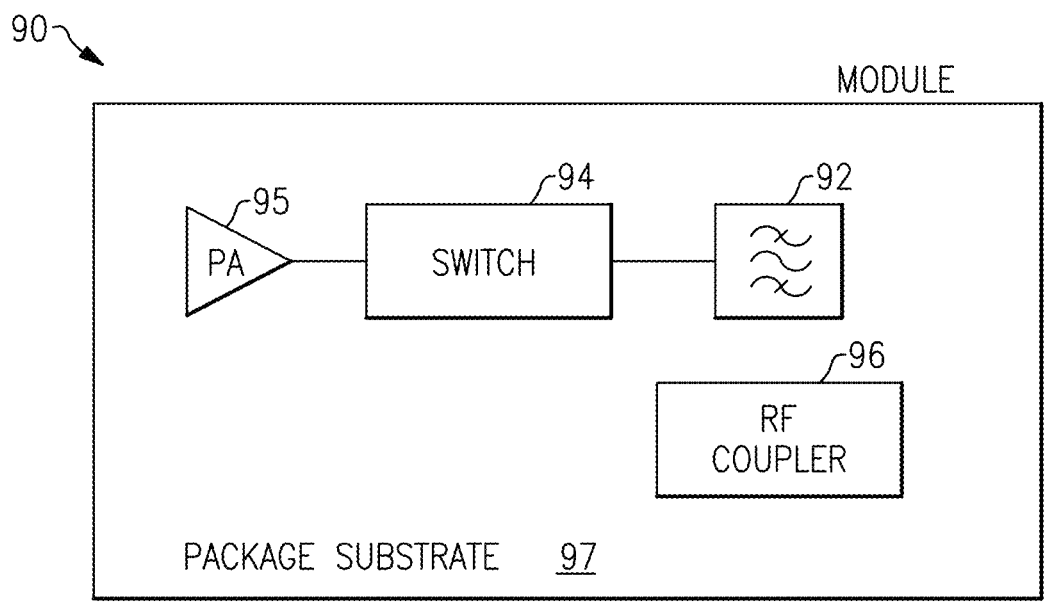
FIG. 26 is a schematic block diagram of a packaged module that includes a filter with an acoustic wave device according to an embodiment.

FIG. 26 is a schematic block diagram of a module 90 that includes a filter 92 with one or more acoustic wave devices in accordance with any suitable principles and advantage disclosed herein. The module 90 includes the filter 92 that includes the one or more acoustic wave devices, a switch 94, a power amplifier 95, and a radio frequency (RF) coupler 96. The power amplifier 95 can amplify a radio frequency signal. The switch 94 can selectively electrically couple an output of the power amplifier 95 to the filter 92. The filter 92 can be a band pass filter. The filter 92 can be included in a duplexer or other multiplexer. The RF coupler 96 can be a directional coupler or any other suitable RF coupler. The RF coupler 96 can sample a portion of RF power in a transmit signal path and provide an indication of the RF power. The RF coupler 96 can be coupled to the transmit signal path in any suitable point, such as between an output of the power amplifier 95 and an input to the switch 94. The module 90 can include a package that encloses the illustrated elements.

The filter 92 with the acoustic wave resonator can be disposed on a common packaging substrate 97 with the other illustrated elements of the module 90. The packaging substrate 97 can be a laminate substrate, for example.

Figure 27:
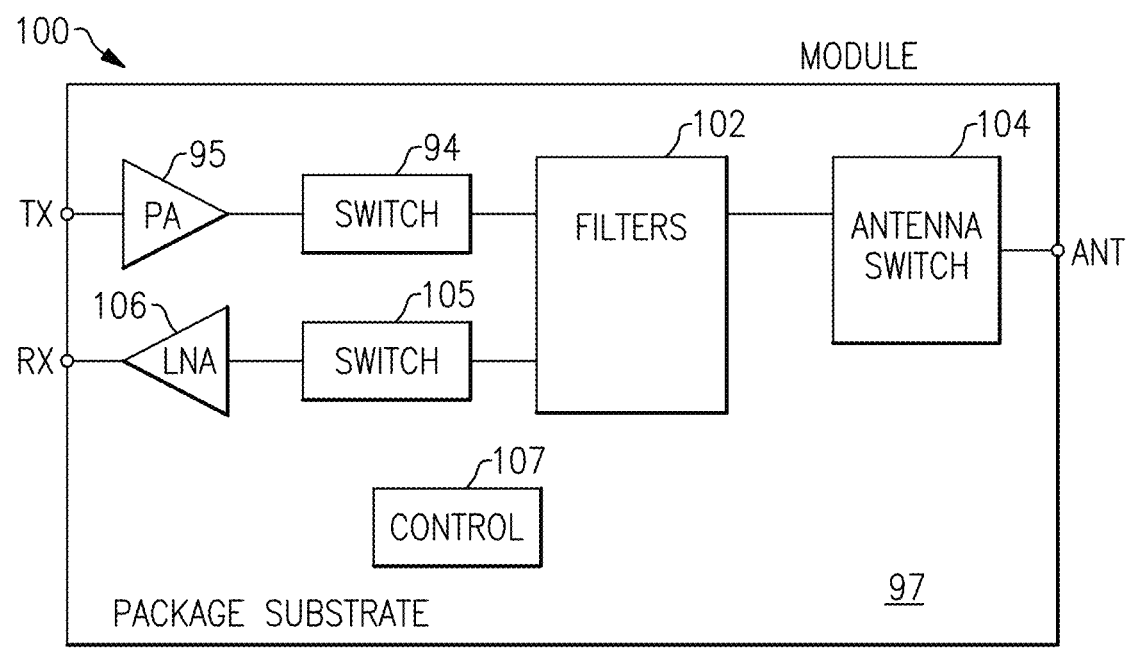
FIG. 27 is a schematic block diagram of a packaged module that includes a filter with an acoustic wave device according to another embodiment.

FIG. 27 is a schematic block diagram of a module 100 that includes filters 102 that include one or more acoustic wave devices in accordance with any suitable principles and advantage disclosed herein. As illustrated, the module 100 includes a power amplifier 95, a switch 94, filters 102, an antenna switch 104, a switch 105, a low noise amplifier 106, and a control circuit 107.

The power amplifier 95 can receive a radio frequency signal from a transmit port TX. In some instances, a switch can electrically connect a selected one of a plurality of transmit ports to an input of the power amplifier 95. The power amplifier 95 can operate in an envelope tracking mode and/or an average power tracking mode. The switch 94 can be a multi-throw radio frequency switch configured to electrically connect an output of the power amplifier 95 to one or more selected transmit filters of the filters 102. The switch 94 can be a band select switch arranged to electrically connect the output of the power amplifier 95 to a transmit filter for a particular frequency band.

The filters 102 can be acoustic wave filters (e.g., ladder filters). One or more resonators in any of the filters 102 can include a negative TCF film or a positive TCF film and/or a wider duty factor (DF) in accordance with any suitable principles and advantages disclosed herein. The filters 102 can include a plurality of duplexers and/or other multiplexers. Alternatively or additionally, the filters 102 can include one or more standalone transmit filters and/or one or more standalone receive filters. The filters 102 can include at least four duplexers in some applications. According to some other applications, the filters 102 can include at least eight duplexers.

As illustrated, the filters 102 are electrically connected to the antenna switch 104. The antenna switch 104 can be a multi-throw radio frequency switch arranged to electrically connect one or more filters of the filters 102 to an antenna port ANT of the module 100. The antenna switch 104 can include at least eight throws in some applications. In certain applications, the antenna switch 104 can include at least ten throws.

A switch 105 can electrically connect a selected receive filter of the filters to a low noise amplifier 106. The low noise amplifier 106 is arranged to amplify the received radio frequency signal and provide an output to a receive port RX. In some instances, another switch can be electrically coupled between the low noise amplifier 106 and the receive port RX.

The illustrated module 100 also includes a control circuit 107. The control circuit 107 can perform any suitable control functions for the module 100.

Figure 28A:
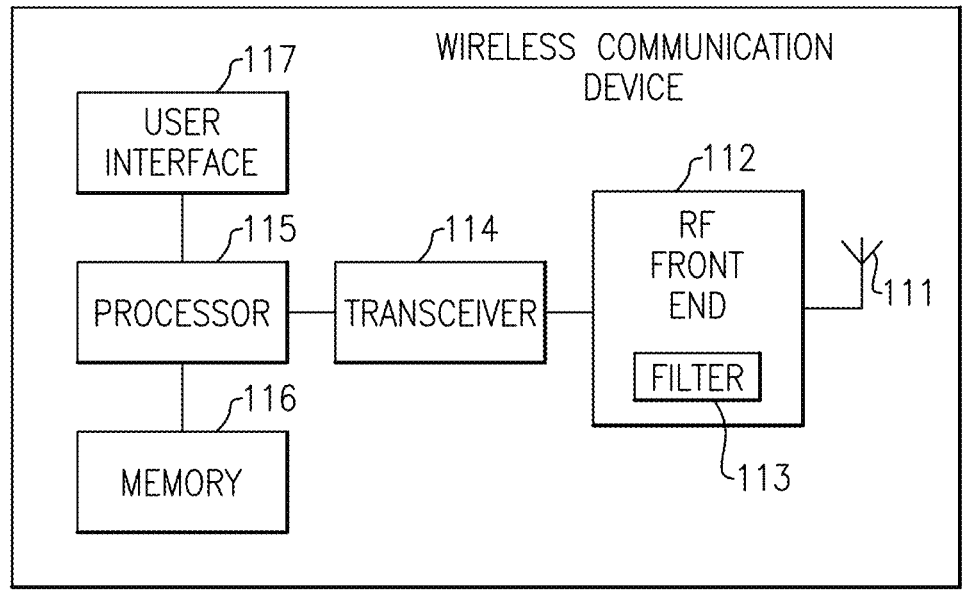
FIG. 28A is a schematic block diagram of a wireless communication device that includes a filter with an acoustic wave device according to an embodiment.

FIG. 28A is a schematic block diagram of a wireless communication device 110 that includes a filter 113 with an acoustic wave device in accordance with one or more embodiments. The wireless communication device 110 can be any suitable wireless communication device. For instance, a wireless communication device 110 can be a mobile phone, such as a smart phone. As illustrated, the wireless communication device 110 includes an antenna 111, an RF front end 112, an RF transceiver 114, a processor 115, a memory 116, and a user interface 117. The antenna 111 can transmit RF signals provided by the RF front end 112. The antenna 111 can provide received RF signals to the RF front end 112 for processing.

The RF front end 112 can include one or more power amplifiers, one or more low noise amplifiers, one or more RF switches, one or more receive filters, one or more transmit filters, one or more duplex filters, one or more filters of a multiplexer, one or more filters of a diplexer or other frequency multiplexing circuit, or any suitable combination thereof. The RF front end 112 can transmit and receive RF signals associated with any suitable communication standard. Any of the acoustic resonators disclosed herein can be implemented in filter 113 of the RF front end 112.

The RF transceiver 114 can provide RF signals to the RF front end 112 for amplification and/or other processing. The RF transceiver 114 can also process an RF signal provided by a low noise amplifier of the RF front end 112. The RF transceiver 114 is in communication with the processor 115. The processor 115 can be a baseband processor. The processor 115 can provide any suitable base band processing functions for the wireless communication device 110. The memory 116 can be accessed by the processor 115. The memory 116 can store any suitable data for the wireless communication device 110. The processor 115 is also in communication with the user interface 117. The user interface 117 can be any suitable user interface, such as a display.

Figure 28B:
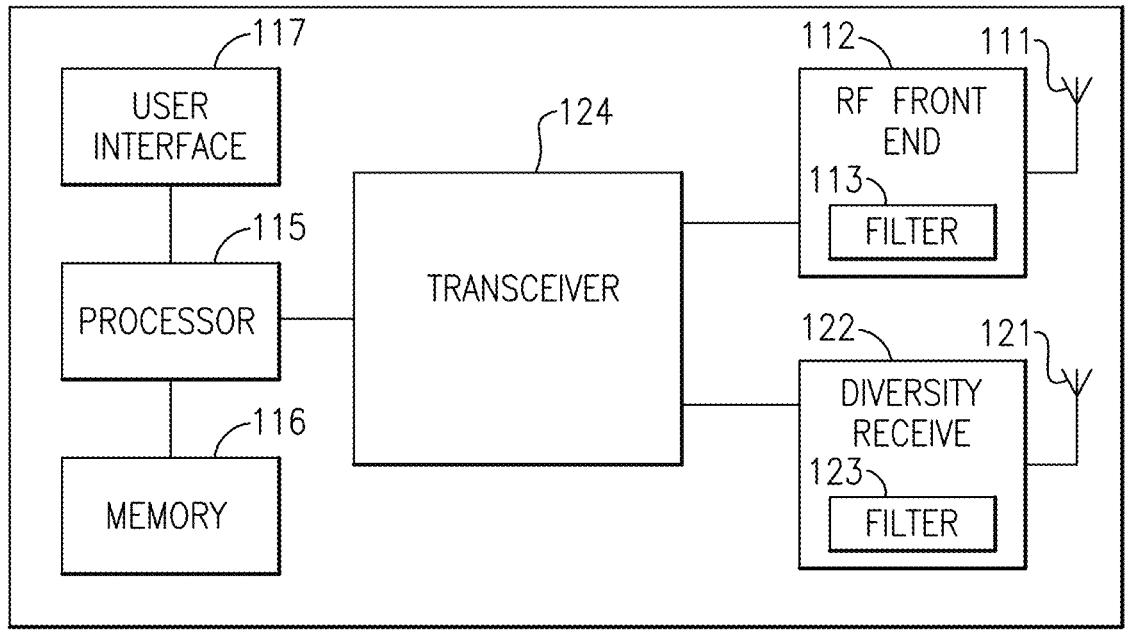
FIG. 28B is a schematic block diagram of a wireless communication device that includes a filter with an acoustic wave device according to another embodiment.

FIG. 28B is a schematic block diagram of a wireless communication device 120 that includes a radio frequency front end 112 with a filter 113 and a diversity receive module 122 with a filter 123 according to an embodiment. The wireless communication device 120 is like the wireless communication device 110 of FIG. 28A, except that the wireless communication device 120 also includes diversity receive features. As illustrated in FIG. 28B, the wireless communication device 120 includes a diversity antenna 121, a diversity receive module 122 configured to process signals received by the diversity antenna 121 and including filters 123, and a transceiver 124 in communication with both the radio frequency front end 112 and the diversity receive module 122. The filter 103 can include one or more ladder filters as disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kilohertz (kHz) to 300 gigahertz (GHz), such as in a frequency range from about 450 MHz to 8.5 GHz. An acoustic wave resonator including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave filter comprising:
a substrate;
a piezoelectric layer disposed over the substrate;
a first plurality of acoustic wave resonators disposed over the piezoelectric layer and arranged in series along a first branch, each of the first plurality of acoustic wave resonators including an interdigital transducer electrode interposed between a pair of reflectors;
a second plurality of acoustic wave resonators disposed over the piezoelectric layer and arranged in parallel, each of the second plurality of acoustic wave resonators including an interdigital transducer electrode interposed between a pair of reflectors and being connected to the first branch and to ground; and
a layer of positive temperature coefficient of frequency dielectric material disposed over one or more of the first plurality of acoustic wave resonators and having a first height above the substrate, and a second layer of positive temperature coefficient of frequency dielectric material disposed over one or more of the second plurality of acoustic wave resonators and having a second height above the substrate that is smaller than the first height.

2. The acoustic wave filter of claim 1 wherein the first plurality of acoustic wave resonators and the second plurality of acoustic wave resonators are surface acoustic wave resonators.

3. The acoustic wave filter of claim 1 wherein an additional layer is disposed between the substrate and the piezoelectric layer, the additional layer having a lower acoustic impedance than the substrate and configured to facilitate adhesion between the substrate and the piezoelectric layer.

4. The acoustic wave filter of claim 1 wherein the layer of positive temperature coefficient of frequency dielectric material is disposed over each of the first plurality of acoustic wave resonators.

5. The acoustic wave filter of claim 1 wherein the second layer of positive temperature coefficient of frequency dielectric material is a single continuous layer that covers the first plurality of acoustic wave resonators and the second plurality of acoustic wave resonators, the layer of positive temperature coefficient of frequency dielectric material being disposed over the second layer of positive temperature coefficient of frequency dielectric material.

6. The acoustic wave filter of claim 1 wherein the interdigital transducer electrode of one or more of the first plurality of acoustic wave resonators has a duty factor that is wider than a duty factor of the interdigital transducer electrodes of the second plurality of acoustic wave resonators.

7. A radio frequency module comprising:
a package substrate;
an acoustic wave filter configured to filter a radio frequency signal, the acoustic wave filter including a substrate, a piezoelectric layer over the substrate, a first plurality of acoustic wave resonators disposed over the piezoelectric layer and arranged in series along a first branch, each of the first plurality of acoustic wave resonators including an interdigital transducer electrode interposed between a pair of reflectors, a second plurality of acoustic wave resonators disposed over the piezoelectric layer and arranged in parallel, each of the second plurality of acoustic wave resonators including an interdigital transducer electrode interposed between a pair of reflectors and being connected to the first branch and to ground, a layer of positive temperature coefficient of frequency dielectric material disposed over one or more of the first plurality of acoustic wave resonators and having a first height above the substrate, and a second layer of positive temperature coefficient of frequency dielectric material disposed over one or more of the second plurality of acoustic wave resonators and having a second height above the substrate that is smaller than the first height; and additional circuitry, the acoustic wave filter and additional circuitry disposed on the package substrate.

8. The radio frequency module of claim 7 wherein the first plurality of acoustic wave resonators and the second plurality of acoustic wave resonators are surface acoustic wave resonators.

9. The radio frequency module of claim 7 wherein an additional layer is disposed between the substrate and the piezoelectric layer, the additional layer having a lower acoustic impedance than the substrate and configured to facilitate adhesion between the substrate and the piezoelectric layer.

10. The radio frequency module of claim 7 wherein the layer of positive temperature coefficient of frequency dielectric material is disposed over each of the first plurality of acoustic wave resonators.

11. The radio frequency module of claim 7 wherein the second layer of positive temperature coefficient of frequency dielectric material is a single continuous layer that covers the first plurality of acoustic wave resonators and the second plurality of acoustic wave resonators, the layer of positive temperature coefficient of frequency dielectric material being disposed over the second layer of positive temperature coefficient of frequency dielectric material.

12. The radio frequency module of claim 7 wherein the interdigital transducer electrode of one or more of the first plurality of acoustic wave resonators has a duty factor that is wider than a duty factor of the interdigital transducer electrodes of the second plurality of acoustic wave resonators.

13. A wireless communication device comprising:
an antenna; and
a front end module including an acoustic wave filter configured to filter a radio frequency signal associated with the antenna, the acoustic wave filter including a substrate, a piezoelectric layer over the substrate, a first plurality of acoustic wave resonators disposed over the piezoelectric layer and arranged in series along a first branch, each of the first plurality of acoustic wave resonators including an interdigital transducer electrode interposed between a pair of reflectors, a second plurality of acoustic wave resonators disposed over the piezoelectric layer and arranged in parallel, each of the second plurality of acoustic wave resonators including an interdigital transducer electrode interposed between a pair of reflectors and being connected to the first branch and to ground, a layer of positive temperature coefficient of frequency dielectric material disposed over one or more of the first plurality of acoustic wave resonators and having a first height above the substrate, and a second layer of positive temperature coefficient of frequency dielectric material disposed over one or more of the second plurality of acoustic wave resonators and having a second height above the substrate that is smaller than the first height.

14. The wireless communication device of claim 13 wherein the first plurality of acoustic wave resonators and the second plurality of acoustic wave resonators are surface acoustic wave resonators.

15. The wireless communication device of claim 13 wherein an additional layer is disposed between the substrate and the piezoelectric layer, the additional layer having a lower acoustic impedance than the substrate and configured to facilitate adhesion between the substrate and the piezoelectric layer.

16. The wireless communication device of claim 13 wherein the layer of positive temperature coefficient of frequency dielectric material is disposed over each of the first plurality of acoustic wave resonators.

17. The wireless communication device of claim 13 wherein the second layer of positive temperature coefficient of frequency dielectric material is a single continuous layer that covers the first plurality of acoustic wave resonators and the second plurality of acoustic wave resonators, the layer of positive temperature coefficient of frequency dielectric material being disposed over the second layer of positive temperature coefficient of frequency dielectric material.

18. The wireless communication device of claim 13 wherein the interdigital transducer electrode of one or more of the first plurality of acoustic wave resonators has a duty factor that is wider than a duty factor of the interdigital transducer electrodes of the second plurality of acoustic wave resonators.

* * * * *